United States Patent [19]
Dressen

[11] Patent Number: 5,770,842
[45] Date of Patent: Jun. 23, 1998

[54] LOCATION MONITORING OF WAFER BATCHES

[76] Inventor: Larry G. Dressen, 7325 W. Shoreline Dr., Waconia, Minn. 55387

[21] Appl. No.: 488,574

[22] Filed: Jun. 8, 1995

[51] Int. Cl.⁶ .................................................. G06F 15/46
[52] U.S. Cl. ........................... 235/376; 235/375; 235/380
[58] Field of Search .................................. 235/375, 376, 235/380

[56] References Cited

U.S. PATENT DOCUMENTS

| | | | |
|---|---|---|---|
| 4,500,080 | 2/1985 | Aigo | 235/380 |
| 4,827,110 | 5/1989 | Rossi et al. | 235/376 |
| 4,833,306 | 5/1989 | Milbrett | 235/375 |
| 4,888,473 | 12/1989 | Rossi et al. | 235/376 |

*Primary Examiner*—Harold Pitts
*Attorney, Agent, or Firm*—Larkin, Hoffman, Daley & Lindgren

[57] ABSTRACT

A wafer cassette for storing, transporting and processing a plurality of wafers has a versatile adapter for removably receiving and attaching a transponder device to any convenient, predetermined surface location on the wafer cassette. The apparatus including the versatile adapter allows the wafer cassette to be used with a wide variety of processing equipment and fixtures without modification or customization, in contrast to similar apparatus known in the art.

8 Claims, 4 Drawing Sheets

LOCATION MONITORING OF WAFER BATCHES

BACKGROUND OF THE INVENTION

1. Field of the Invention

The present invention relates generally to the identification and tracking of disc batches through a multi-stage process. More specifically, it relates to an apparatus for monitoring the location of a plurality of memory disks or semiconductor wafers aligned for processing through a multi-stage, multi-location process within a manufacturing facility.

2. Description of the Prior Art

In the memory disk and semiconductor manufacturing industries, it is common to handle wafers or disks in batches contained within carriers or cassettes, which are moved through a manufacturing plant to a number of different locations where the semiconductor wafers or memory disks are etched, cleaned, processed using photolithography or plating and sputtering operations, tested and subjected to various other processing and testing operations. Carriers or cassettes are designed for the purpose of supporting the manufacturing and processing machinery which may either process the disks or wafers while they remain in the cassette or carrier, or the disks or wafers are removed for a processing operation and returned to the carrier after completion of the operation. A batch, as defined herein, is intended to mean one or more of the semiconductor wafers or memory disks up to the carrier or cassette capacity.

It is desirable to track the progress or location of a batch of wafers or disks throughout the above referenced processing operations. In the past, this has been accomplished on a manual basis, either by generating paper records to track the progress specific batches through the processing operations, or some semi-automated system such as manual keyboard entry. Bar code technology has also been utilized. However, to be effective, the bar code readers must be placed in close proximity to the bar code strip. Additionally, illumination of the bar code may also be required, such as visual or infrared illumination, to provide a readout of the coded information.

Present bar code stickers present several problems. First, the stickers usually will not adhere to carriers or cassettes molded from Teflon™ or similarly suitable material. Bar code stickers may not survive the processing operations, which may involve submersion into chemical solutions. Attempts have been made to protect the bar code stickers using a transparent material or laminates; however, this has proven unsatisfactory because of the possible difficulty in reading the bar codes accurately through the coating or the vulnerability of the coating itself, meaning that the coating itself may not survive the processing operations and, thus, will not stick to the carriers or cassettes.

Workers may also be given bar code reader wands to read the bar code strips which may either be placed on the cassette or carrier or on each wafer. However, the introduction of particulate contamination is greatly increased, again due to the requirement that the bar code reader must be in close proximity to the bar code strip.

Identification of objects using radio frequency interrogation of transponder tag structures have exited for about the past twenty-five years. One technique to monitor semiconductor wafers or memory disks through various manufacturing and processing operations has been disclosed in U.S. Pat. No. 4,827,110, issues May 2, 1989, to Rossi et al., entitled *Method and Apparatus for Monitoring the Location of Wafer Disks*. Rossi et al. disclose an apparatus and method for addressing monitoring problems by providing a system utilizing RF interrogation of coded surface acoustic wave transponder structures to provide a means for identification and tracking of semiconductor wafer or memory disks through manufacturing and processing locations within a plant. Specifically, a transponder tag is mounted on the outside surface of a vertical wall of a carrier, wherein tag includes a transmitting antenna oriented perpendicular to the plane of the disks within a carrier.

The apparatus disclosed by Rossi et al. has limitations in that the apparatus may not necessarily be optimally designed to function with or be integrated with existing specific dedicated manufacturing equipment, fixtures, etc. Thus, a need exists for a more versatile apparatus capable of being quickly and easily modified or adapted to function with a wide variety of manufacturing equipment and fixtures, and still be capable of being monitored via RF interrogation without impairing the quality, reliability and integrity of the monitoring process.

Accordingly, it is desirable to provide an apparatus for monitoring memory or semiconductor disk batches which overcomes the shortcomings of the prior art systems described above.

SUMMARY OF THE INVENTION

The general purpose of the present invention is to provide a semiconductor wafer or memory disk processing cassette, or carrier, including an adapter means for mounting a versatile location monitor for use in monitoring wafer batch locations during on-center wafer or disk processing of wafer or disk-filled cassettes or carriers by present day advanced robotic wafer/disk processing equipment utilized in a multi-step processing operation. One embodiment for the present inventive wafer processing cassette includes an integral structure having strategically located mirror image ends having deep reverse arch spray areas. The cassette also includes geometrically configured and reinforced dual profile geometrically configured wafer/disk dividers, with multi-level spray ports between the wafer/disk dividers, providing open, non-restricted areas for inner cassette process wash entry for processing. The cassette is constructed of smooth surfaced, non-porous, polybutyleneterphthalate (PBT) or similarly appropriate material having rounded edges and corner members, ramped surfaces, and radiused vertex slots incorporated throughout, thereby facilitating fast, efficient drainage and drying of the cassette. The cassette is of minimal weight, providing for a lower unit cost to the end user. The cassette has an adapter means, as stated hereinbefore, which preferably is integral with an outer surface of the cassette.

According to one embodiment of the present invention, there is provided a wafer/disk processing cassette for processing of wafers/disks, including mirror image like ends with downwardly descending, inverted arches having rounded edge members, including an open area thereabove and rectangular lower beveled edge open portions; right and left sides, including upper edge members; forward and rearward vertical support robotic pickup members in support of the upper members; a plurality of upper and lower reinforced wafer dividers having geometrically distinct shaped upper and lower teeth, the tops of which slope and the exterior portions being more rounded in shape than the interior portions of the teeth; radiused vertex wafer/disk indexing slots; upper and lower process wash ports; opposing horizontal longitudinal structural supports, secured to the front left end and the rear right end at the upper and mid-portions of the dividers; and ramped lower tooth portions joining vertical reinforced lower members, the lower members being positioned between the left and right ends, the lower members further including bottom rounded edges, recessed edges, and positioning grooves. Smooth surfaces, ramped surfaces, radiused vertex slots, and rounded edge members throughout the cassette facilitate rapid cassette drainage and drying. The downwardly arched ends provide for maximum open end areas. The upper and lower dividers and corresponding upper and lower process wash slots, with geometrically dual rounded face configured teeth, provide for minimum surface side wall areas for maximizing processing functions, thereby providing fully functional, strategically located, low wash entry profile, least weight wafer cassette of structural integrity for on-center processing of wafers/disks.

Also, according to one embodiment of the present invention, there is provided an adapter means attached to the wafer/disk cassette so that a versatile transponder device can be coupled to the cassette, thereby allowing the location of the cassette to be monitored as the cassette moves through the processing operations. Preferably, the adapter means is integral with a predetermined convenient surface of the wafer/disk cassette so as not to interfere with any existing wafer batch processing operation, equipment or fixtures. One preferred embodiment for the adapter means includes at least two arched protrusions extending normally from the selected cassette surface, such that a substantially circular port is formed by the protrusions. A transponder device, including a passive RF emitting material coupled to an antenna for amplifying an RF signal generated by the passive material, has a fitting adapted to be removably placed in the circular port via a friction fit. The transponder device, having material uniquely formed to generate a characteristic RF signal is provided for each cassette. The characteristic RF signal uniquely identifies the specific cassette, and henceforth, a batch of wafers/disks contained therein. Each cassette can then be detected by a multiplicity of reader units, each of which is positioned at discrete locations throughout the respective processing operation, thus determining the unique identification of any cassette within the reader unit detection range. The cassette identification information from the reader units is stored and updated to monitor the location and progress of each batch through a processing operation.

One significant feature of the present invention is a wafer/disk processing cassette which provides an adapter means integral to a surface of the wafer/disk cassette in any predetermined convenient position, increasing the versatility of the cassette so as to be accommodated in a wide variety of present day robotic wafer/disk automated machines, as a reader unit may be placed in any convenient position without requiring reconfiguration of automated wafer/disk processing machines/fixtures in order to monitor wafer/disk cassette location throughout the processing operations.

Another significant feature of the present invention is a wafer/disk processing cassette which provides an adapter means integral to a cassette surface which accommodates a suitable transponder device via a friction fit and is capable of easy removal or replacement.

A further significant feature of the present invention is a wafer/disk processing cassette which provides a singular sealed transponder device having a passive RF element adapted for modifying the phase of a received RF signal in accordance with a predetermined code and a transmitting antenna as a single sealed removable unit.

BRIEF DESCRIPTION OF THE DRAWINGS

Other features of the present invention and many of the attendant advantages of the present invention will be readily appreciated as the same becomes better understood by reference to the detailed description when considered in connection with the accompanying drawings in which like reference numerals designate like parts throughout the figures thereof and wherein.

DETAILED DESCRIPTION OF THE PREFERRED EMBODIMENTS

The preferred embodiment of the present invention described as follows, addresses the considerable problems associated with monitoring wafer/disk batches passing through multiple processing operations. The invention includes a wafer/disk processing cassette having an adapter means for attaching a transponder device and may also include additional optional adapter means to expand the capability of the system.

Figure 1A:
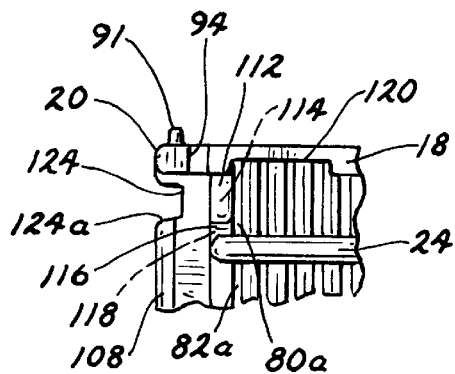
FIGS. 1 and 1a illustrates a plan view of one preferred embodiment of the present inventive wafer/disk cassette having an adapter means for attaching a transponder device.
Figure 1:
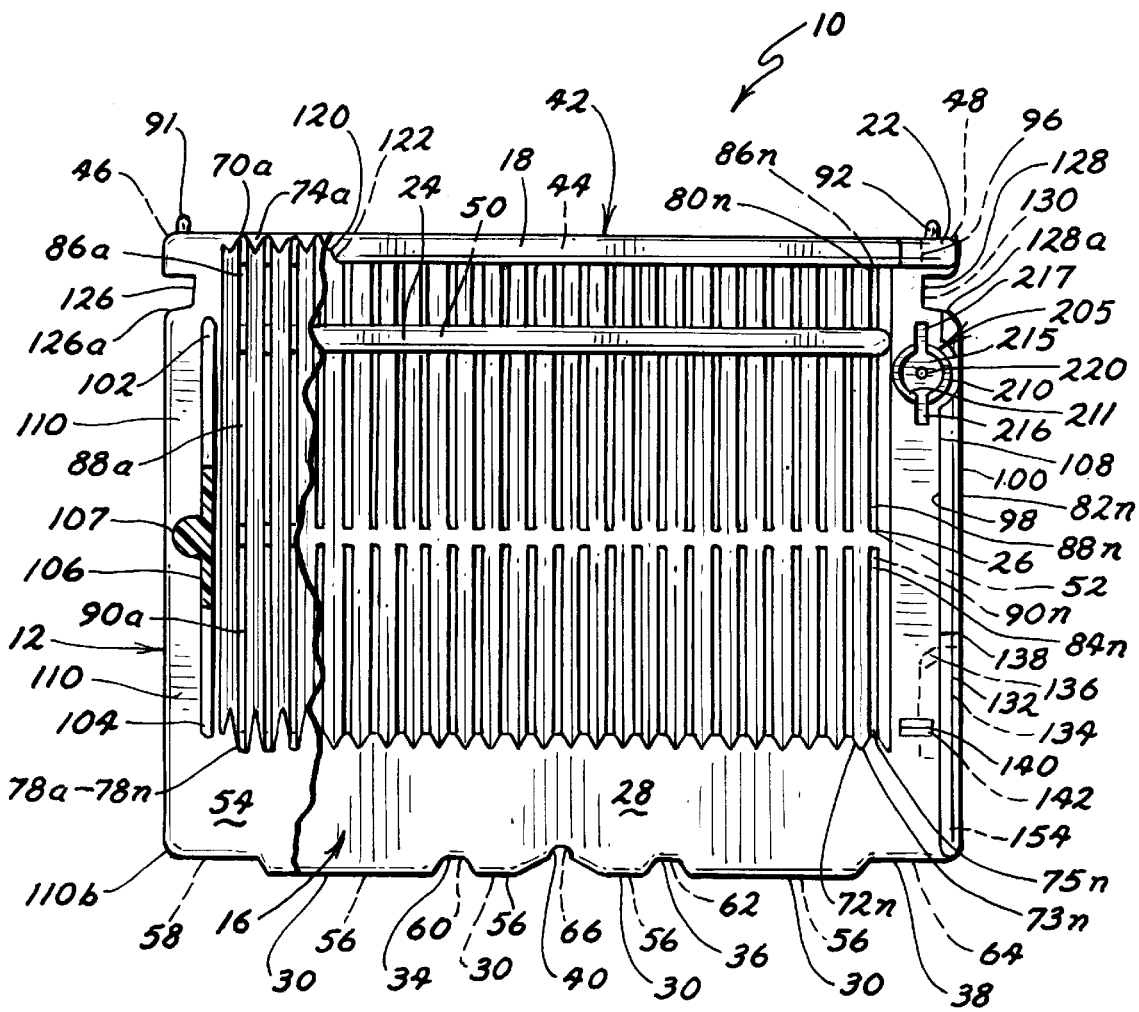
Figure 2:
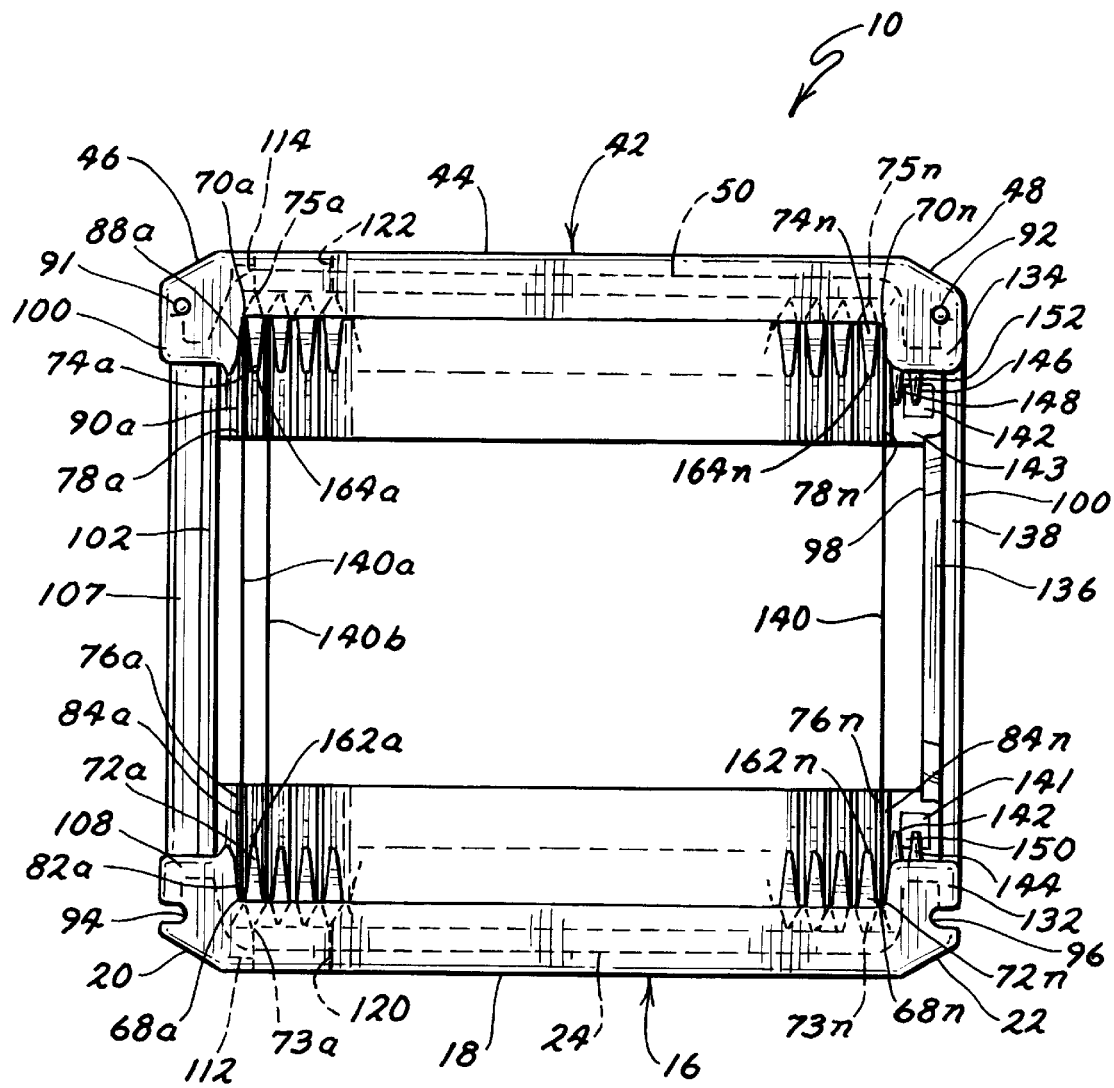
FIG. 2 illustrates a top view of the wafer/disk cassette shown in FIG. 1, depicting an adapter means for attaching a transponder device.
Figure 3:
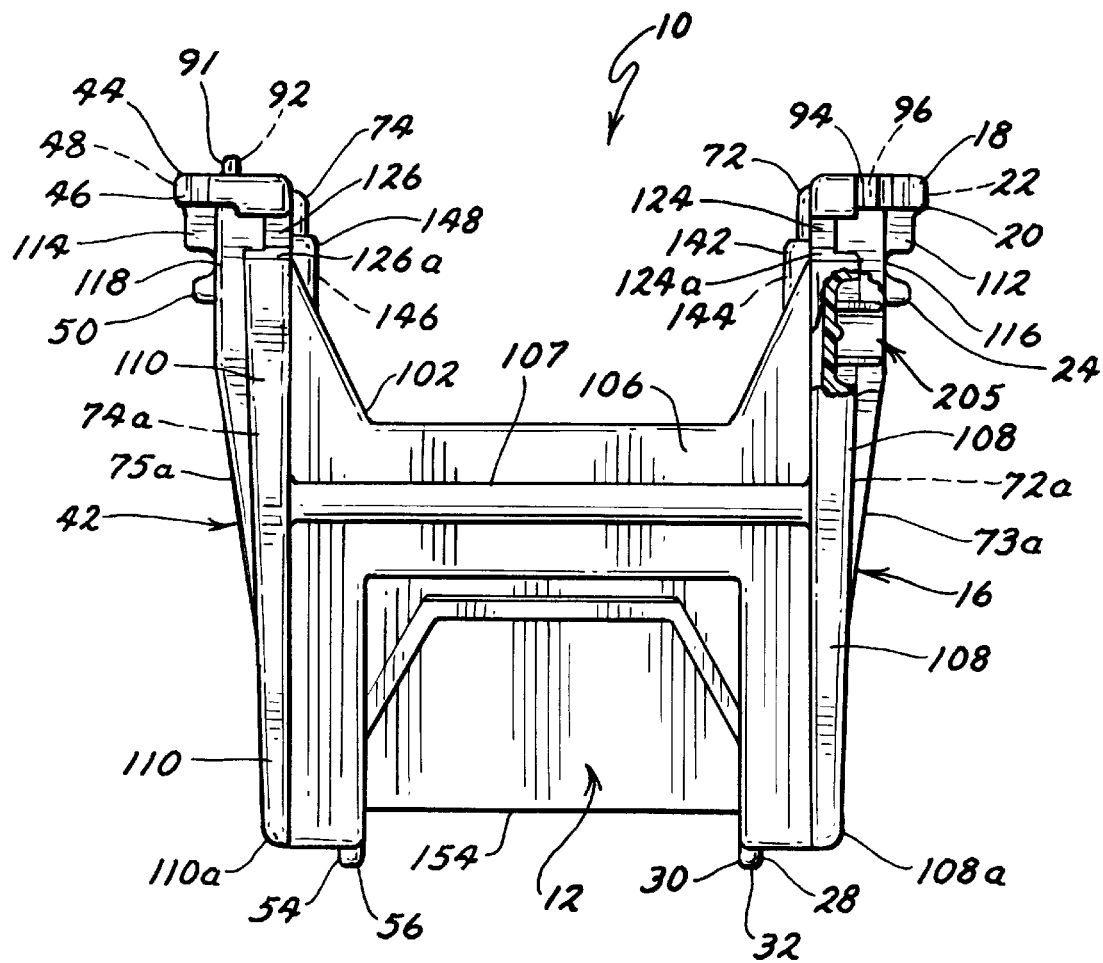
Figure 4:
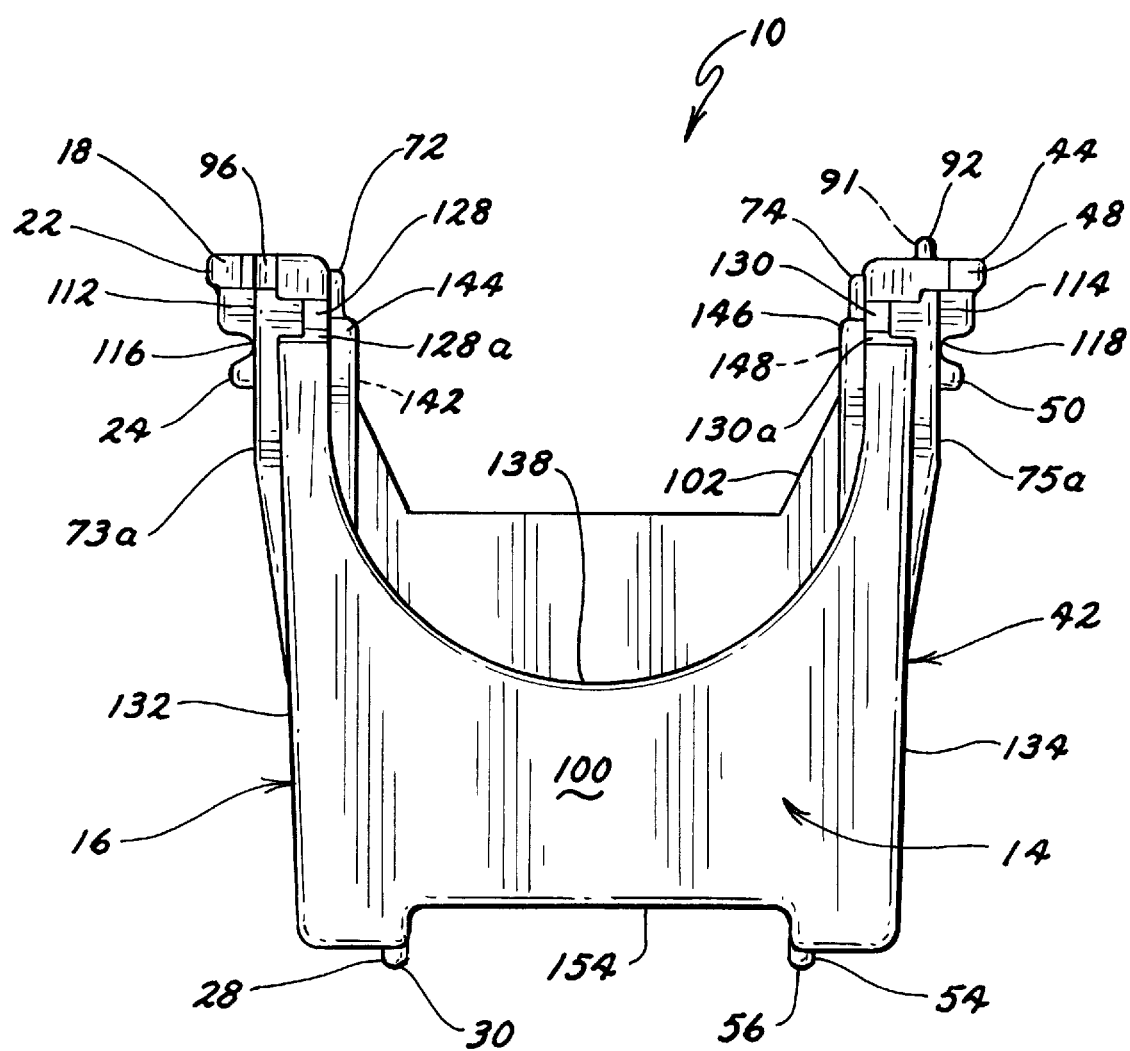
FIG. 4 illustrates a rear end view of the wafer/disk cassette shown in FIG. 1.

Looking now at FIG. 1, there is illustrated a plan view, including a partial cut-away section, of one preferred embodiment for the present inventive wafer/disk processing cassette 10, depicted as a high profile style cassette, for monitoring the location during processing or transporting of wafers or disks, e.g., integrated circuit wafers/disks (silicone wafers). Reference is also made to FIGS. 2–4 in the following description. Because the technology herein is equally suitable for semiconductor wafers or computer memory disks, as stated hereinbefore, the term "wafer" is hereinafter used to designate either type of product as well as any other generally similar product having a thickness which is substantially less than the width. The term "cassette" is hereinafter used to designate a suitable casing for such wafers, such as carrier, storage unit, transporter, processing container or any other generally similar casing capable of accommodating a plurality of such wafers. In the past, such cassettes have been tracked through processing and transporting operations by associating paper records with cassettes containing particular wafer batches, such that the location monitoring was manually tracked.

The wafer cassette 10, includes a cross-bar 106, also illustrated in FIG. 3, which incorporates open areas, a rear end 14 which incorporates open areas, also illustrated in FIG. 4, an angled rounded right side 16, including a right upper edge member 18, beveled corner surfaces 20, 22 positioned at the outward ends of member 18, a right upper beveled top horizontal structure support 24, a right lower partial section of a cylindrical support rod 26, a right horizontal lower edge member 28, a right lower rounded bottom edge 30 including liquid drainage recesses 32, 34, 36, 38 and ramped centering position hole 40 which is also a liquid drainage recess. An angled rounded left side 42 includes left upper edge member 44, left side upper edge member beveled corner surfaces 46, 48 located at the outward ends of member 44, a left upper beveled top horizontal structure support 50, a left horizontal lower partial section of a cylindrical support rod 52, a left lower edge member 54, a left lower rounded bottom edge 56 including liquid drainage recesses 58,60,62,64, and ramped centering positioning hole 66 which is also a liquid drainage recess. A plurality of right radiused vertex indexing slots 68a–68n oppose left radiused vertex indexing slots 70a–70n, and are also provided for in the lower edge members 28,54. A plurality of geometrically configured wafer dividers, the cross-section of the upper portion being different than that of the lower divider cross-section, assume geometrical shapes of rounded teeth 72a–72n and 74a–74n with rounded teeth backs 73a–73n and 75a–75n, the teeth being rounded on the exterior and interior teeth end points. The teeth are in opposing alignment with respect to each other as also illustrated in FIG. 2, and supported in turn by upper edge members 18,44. Beveled structure horizontal support members 24,50, lower partial cylinder support rod members 26,52, and lower edge members 28,54 extend between the cross-bar end 12 and the rear end 14. Lower slot support seat areas 76a–76n and 78a–78n are radiused to conform to the specific radius size of the wafer being processed. Lower horizontal partial cylinder support rods 26,52 lend slight additional tangential contact support to the wafer edges, keeping the wafers secure within the indexing slots 68a–68n and 70a–70n. These supports extend outwardly along a portion of the horizontal length as illustrated in the figures.

Right side upper wash process ports 80a–80n, mid-wash ports 82a–82n, and lower wash ports 84a–84n are formed between the grids fashioned by teeth 72a–72n and right upper edge member 18, right beveled horizontal support structure 24, right lower partial section support rod 26 and right lower edge member 28. In a similar fashion, left side upper wash process ports 86a–86n, mid-wash process ports 88a–88n, and lower wash process ports 90a–90n are formed between grids formed by teeth 74a–74n and left upper member 44, left beveled horizontal support structure 50, left lower partial section support rod 52 and left lower edge member 54, providing for maximum fluid flow and pressurized liquid processing chemical or other liquid entry at upper, middle, and lower side areas 16 and 42 of the wafer cassette 10. The narrow profile, non-blunt, teeth allow maximum ease of liquid processing chemical entry as discussed later.

The wafer processing cassette 10 includes locating pins 90,92 and locating notches 94,96 positioned on or in upper edge members 44,18. The cassette 10 also includes interior side 98 and exterior side 100 located at the rear end 14. The cross-bar end 12 includes a rounded ramped top edge 102 and an open area above a rounded lower edge 104 with a rectangular like open area beneath, as illustrated in FIG. 3. The cross-bar horizontal member 106 includes a partial section of a cylindrical rod 107 extending between right vertical angled support member 108 and left vertical angled support member 110. Cross-bar end 12 and the vertical angled support members 108,110 provide for additional support and bearing surfaces where the large radius corners 108a, 110b provide for quick and efficient drainage of members 108,110.

Support bars 112,114 are positioned beneath upper edge members 18,44 and form with the upper end surface horizontal structure supports 24,50, handling slot recesses 116, 118. Handling slot recesses 120,122 are located above and inboard from support bars 112,114, located in the under surface of horizontal structure supports 18,44 respectively. Recessed handling slots 124,126, with sloped drain surfaces 124a, 126a, are positioned with angled vertical support members 108,110. Recessed handling slots 128,130, including sloped drain surfaces 128a, 130a, are positioned in the upper ends of angled vertical support members 132,134 of rear end 14. A beveled arched processing handle lip 136 positioned across interior wall surface 98 just below inverted reverse arch 138, as also shown in FIG. 3, enhances structural support across rear end 14, between the angled vertical members 132,134 and also aids in drainage.

Looking again at FIG. 1, wafer processing cassette 10 includes one preferred embodiment for adapter means 205 located on vertical angled support member 108. Adapter means 205 includes at least two normally extended radiused ears 210,211. Extended ears 210,211 form central recess 215 which is substantially circular and extends between extended ears 210,211. Central recess 215 includes central recessed channels 216,217 which extend outwardly between ears 210,211. Center button 220 is centrally located within central recess 215. Center button 220 may either have protruding or recessed configuration. However, one skilled in the art will readily recognize that adapter means 205 must be capable of receiving a transponder device in a corresponding mated fashion as discussed hereinafter.

Moving now to FIG. 2, a top view of the present inventive cassette 10 is illustrated, where all numerals correspond to those elements previously described. Particularly illustrated are wafers 140a–140n being supported in vertex radiused slots 68a–68n and 70a–70n, and resting upon lower slot vertex radiused support areas 76a–76n and 78a–78n in between wafer divider teeth 72a–72n and 74a–74n. The locating pins 91,92 and locating slots 94,96 are positioned on and in upper edge members 44,18, respectively. Recess areas 120,122 and support bars 112,112 are shown beneath upper edge members 18,44 as depicted in FIG. 1. Beveled surfaces 20,22 and beveled surfaces 46,48 are illustrated at ends of upper edge members 18,44 providing for minimum weight of the cassette 10, as stated hereinbefore. Processing handle lip 136 slopes downwardly and outwardly assisting in drainage, along upper surfaces, of process chemicals and washes toward drainage scuppers 140,142 draining the fluids (not shown) to the outside of the cassette 10. Drain holes 140,142 position upon beveled surfaces 141,143 adjacent to the corners formed by the junction of the interior end surface 98 with vertical angled supports 132,134 to aid in centrifugal drainage. Rounded end divider teeth 142–148 are positioned on the upper surfaces of the angled vertical members 132,134 forming identification plaque slots 150, 152.

Looking now at FIG. 3, there is illustrated a front view of the end 12 where all numerals correspond to those elements previously described. In particular, the ramped rounded edge 102 of the cross-bar end 12, as well as the rounded edges 104 of the rectangular portion are illustrated, along with the supporting partial cylindrical rod 107 and adapter means 205. Support bars 112,114 and beveled horizontal structural supports 24,50, form handling slot recesses 116,118. Rounded exterior tooth edges 73a, 75a intersect with the horizontal upper edge members 18,44, upper horizontal beveled structural supports 24,50, lower partial rod supports 26,52, and finally lower edge members 28,54, all of which contribute to structural support and strength of the wafer processing cassette 10. The vertical edges of angled vertical support members 108,110 provide bearing surfaces. The cassette 10 can be utilized in an upright position during automated wafer processing when the cassette is in a horizontal mode or in a vertical mode. Adapter means 205 is located on left vertical support member 110. However, it will be readily appreciated by those skilled in the art that adapter means may be located in any other desired predetermined position such as that illustrated in FIG. 1, for example, where adapter means 205 is located on right vertical support member 108. As contemplated by the present invention, adapter means 205 can be located on any convenient member such as lower edge members 28,54, for example.

Figure 3A:
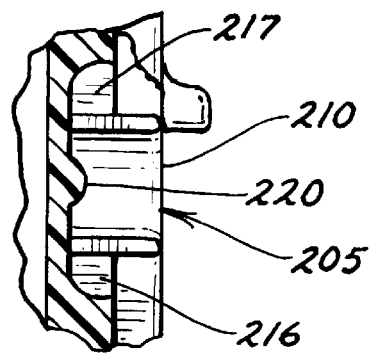
FIG. 3 illustrates a front view of the wafer/disk cassette shown in FIG. 1.

FIG. 3A is a cross-sectional view of adapter means 205 engaged with a transponder device 230. Adapter means 205 includes normally extended radiused ears 210,211, as stated hereinbefore, and which forms a central recess 215 around central button 220. In accordance with the present invention, normally extended radiused ears 210,211 and central button 220 have rounded edges as other edges of portions of cassette 10, for quick and efficient drainage required during wafer processing and handling. Transponder device 230 mates with adapter means 205 via a friction fit and preferably includes an acoustic wave sensitive crystal surface adapted for modifying the phase of a received RF signal in accordance with a predetermined code designating a predetermined wafer batch and wherein the crystal is inductively coupled to a transmitting antenna. Preferably, the transponder device 230 is sealed within an overcap 233, although the transponder device 230 can be of any suitable predetermined configuration. Such transponder devices are well known in the art and therefore, substantial details of such devices will not be discussed here for the sake of clarity and to preserve brevity. For example, a transponder device configuration such as that found in OMRON's SmartFactory™V600/V620 tags, model V600-D23P53 is suitable for use with the present invention. This model includes an antenna coiled about a RF sensitive crystal so that the total diameter is about 0.315 inches and further, includes a 256 byte EEPROM. Thus, transponder device 230 may be substantially circular in shape and can reside in any orientation with respect to wafers contained in cassette 10. It will be understood by those skilled in the art that the present invention is not so limited however, and that other transponder device shapes may just as well be incorporated into the present invention.

Finally, FIG. 4 illustrates a rear end 14 view of the cassette 10 where all numerals correspond to those elements previously described. Particularly illustrated is the rounded edge reversed arch 138, and the rounded open area above. Rounded edge 154 with the end portions of lower edge members 28,54 form a rectangular drainage and process handler recess. Vertical angled support members 132,134 join interior and exterior surfaces 98,100 with reversed arch 138, and provide, with lip 136, additional rear end structural support. Smooth surface 100 serves as a bearing surface.

This invention has been described herein in considerable detail in order to comply with the Patent Statutes and to provide those skilled in the art with the information needed to apply the novel principles and to construct and use such specialized components as are required. However, while a particular embodiment of the present invention has been described herein in detail, it is to be understood that various alternations, modifications and substitutions can be made therein without departing from the spirit and scope of the present invention, as defined in the claims which follow. For example, it will be appreciated that the present invention is not limited to use with a high profile cassette as described in one preferred embodiment, nor does the present invention necessarily require a cassette having the specific features described in a particular preferred embodiment such as particular tooth shapes and sizes, numbers and sizes of support structures, etc. As stated hereinbefore, it will readily be recognized to those skilled in the art that the present invention will therefore encompass any suitable casing for transporting wafers, such as carriers, storage units, transporters, processing containers, or any other generally similar casing capable of accommodating a plurality of such wafers.

I claim:

1. In a cassette for storing, transporting and processing a plurality of wafers or disks, said cassette having a pair of opposing sides, a front end, and a rear end, said cassette defining an interior region and having a plurality of spaced-apart dividers to receive said plurality of wafers or disks disposed within said interior region, at least one of said pair of opposing sides, said front end, or said rear end of said cassette defining an outer wall having an exterior surface, said cassette being used with an tracking member which permits the location of said cassette and said plurality of wafers or disks contained therein to be remotely monitored and tracked as said cassette traverses through a processing environment between a plurality of stations, said processing environment including a plurality of generally upright planar surfaces past which said cassette traverses, said tracking member being selectively mounted on said cassette and having a face oriented generally away from said interior region of said cassette when said tracking member is mounted on said cassette, the improvement comprising:

a recess defined by the exterior surface of the outer wall for receiving the tracking member therein, said recess having a peripheral edge and a side wall, the tracking member being received within said recess such that the face of the tracking member is at least substantially flush with said peripheral edge of said recess and oriented away from the interior region of the cassette, said tracking member being frictionally engaged and retained within said recess by frictional contact between said tracking member and said side wall of said recess, whereby the face of the tracking member will not readily contact any of the plurality of planar surfaces and be damaged by such contact.

2. The improvement of claim 1 wherein the processing environment includes a liquid to which the cassette and the tracking member are exposed, the outer wall of the cassette defining an exterior region surrounding the cassette, the recess, and the tracking member, the recess further comprising:

at least one channel defined by and extending into the outer wall of the cassette and extending between a location disposed outside the peripheral edge of the recess and the side wall of the recess, such that said at least one channel fluidly communicates with the recess, whereby the liquid will drain from within the recess through the at least one channel when the tracking member is received within the recess.

3. The improvement of claim 2 wherein the number of the at least one channel is two.

4. The improvement of claim 1 wherein the tracking member is removed from the recess using a removal instrument, the outer wall of the cassette defining an exterior region surrounding the cassette, the recess, and the tracking member, the recess further comprising:

at least one channel defined by and extending into the outer wall of the cassette and extending between a location disposed outside the peripheral edge of the recess and the side wall of the recess, such that said at least one channel fluidly communicates with the recess, whereby the removal instrument may be inserted within the at least one channel and the recess and between the tracking member and the outer wall of the cassette, and force exerted on the removal instrument which is transmitted by contact to the tracking member to remove the tracking member from the recess.

5. The improvement of claim 4 wherein the number of the at least one channel is two.

6. The improvement of claim 1 wherein the tracking member is a transponder having an antenna, and wherein a signal transmitted from said transponder is detected at the plurality of stations to monitor the location of the cassette, the orientation of said antenna being maintained by the frictional engagement of the transponder within the recess.

7. The improvement of claim 1 wherein the tracking member is a transponder, and wherein a signal transmitted from said transponder is detected at the plurality of stations to monitor the location of the cassette, the transponder being received within the recess such that the face of the transponder is disposed in a recessed position relative to flush with the outer wall of the cassette.

8. In a cassette for storing, transporting, and processing a plurality of wafers or disks, said cassette having a pair of opposing sides, a front end, and a rear end, said cassette defining an interior region and having a plurality of spaced-apart dividers to receive said plurality of wafers or disks disposed within said interior region, at least one of said pair of opposing sides, said front end, or said rear end of said cassette defining a wall having an exterior surface, said cassette being used with an tracking member which permits the location of said cassette and said plurality of wafers or disks contained therein to be remotely monitored and tracked as said cassette traverses through a processing environment between a plurality of stations, said tracking member being selectively mounted on said cassette and having a face oriented generally away from said interior region of said cassette when said tracking member is mounted on said cassette, said processing environment including a liquid to which said cassette and said tracking member are exposed, said tracking member being removed using a removal instrument, and the tracking member the improvement comprising:

a recess defined by the exterior surface of the outer wall for receiving the tracking member therein, said recess having a peripheral edge and a side wall, the tracking member being received within said recess such that the face of the tracking member is at least substantially flush with said peripheral edge of said recess and oriented away from the interior region of the cassette, said tracking member being frictionally engaged and retained within said recess by frictional contact between said tracking member and said side wall of said recess, the outer wall of the cassette defining an exterior region surrounding the cassette, said recess, and the tracking member; and a channel defined by and extending into the outer wall of the cassette and extending between a location disposed outside said peripheral edge of said recess and said side wall of said recess, such that said channel fluidly communicates with said recess, whereby either the liquid will drain from within the recess through the channel when the tracking member is received within the recess, or the removal instrument may be inserted within the channel and the recess and between the tracking member and the outer wall of the cassette, and force exerted on the removal instrument which is transmitted by contact to the tracking member to remove the tracking member from the recess.

* * * * *